(12) United States Patent
Liu et al.

(10) Patent No.: US 10,651,285 B2
(45) Date of Patent: May 12, 2020

(54) METHOD FOR AVOIDING IL REGROWN IN A HKMG PROCESS

(71) Applicant: Shanghai Huali Microelectronics Corporation, Shanghai (CN)

(72) Inventors: Yingming Liu, Shanghai (CN); Yu Bao, Shanghai (CN); Haifeng Zhou, Shanghai (CN); Jingxun Fang, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 15/429,192

(22) Filed: Feb. 10, 2017

(65) Prior Publication Data

US 2018/0175157 A1    Jun. 21, 2018

(30) Foreign Application Priority Data

Dec. 16, 2016   (CN) .......................... 2016 1 1170236

(51) Int. Cl.
| | | |
|---|---|---|
| *H01L 29/51* | (2006.01) | |
| *H01L 21/28* | (2006.01) | |
| *H01L 29/78* | (2006.01) | |
| *H01L 29/66* | (2006.01) | |
| *H01L 29/49* | (2006.01) | |

(52) U.S. Cl.
CPC ...... *H01L 29/517* (2013.01); *H01L 21/28185* (2013.01); *H01L 21/28229* (2013.01); *H01L 29/49* (2013.01); *H01L 29/513* (2013.01); *H01L 29/66545* (2013.01); *H01L 29/78* (2013.01)

(58) Field of Classification Search
None
See application file for complete search history.

(56) References Cited

U.S. PATENT DOCUMENTS

| | | | |
|---|---|---|---|
| 2013/0277743 A1* | 10/2013 | Jagannathan | ..... H01L 21/28211 257/347 |
| 2015/0037930 A1* | 2/2015 | Chen | ................... H01L 21/3221 438/104 |
| 2015/0303311 A1* | 10/2015 | Yu | ....................... H01L 29/7869 257/43 |

* cited by examiner

*Primary Examiner* — Seahvosh Nikmanesh
*Assistant Examiner* — Xiaoming Liu
(74) *Attorney, Agent, or Firm* — Kilpatrick Townsend & Stockton, LLP

(57) ABSTRACT

The present disclosure addresses and solves the current problem of oxygen accumulation in IL after an HKMG stack is formed. A fabrication method is provided for fabricating high-k/metal gate semiconductor device by forming at least one Titanium (Ti) layer between multiple HK layers. A high-k/metal gate semiconductor device including at least one TiO2 layer between multiple HK layers is also provided.

20 Claims, 8 Drawing Sheets

METHOD FOR AVOIDING IL REGROWN IN A HKMG PROCESS

BACKGROUND OF THE INVENTION

The present invention is directed to semiconductor processes and devices.

Since the early days when Dr. Jack Kilby at Texus Instrument invented the integrated circuit, scientists and engineers have made numerous inventions and improvements on semiconductor devices and processes. The last five decades or so have seen a significant reduction in semiconductor sizes, which translate to ever increasing processing speed and decreasing power consumption. And so far, the development of semiconductor has generally followed Moore's Law, which roughly states that the number of transistors in a dense integrated circuit doubles approximately every two years. Now, semiconductor processes are pushing toward below 20 nm, where some companies are now working on 14 nm processes. Just to provide a reference, a silicon atom is about 0.2 nm, which means the distance between two discrete components manufactured by a 20 nm process is just about a hundred silicon atoms.

Manufacturing semiconductor devices has thus become more and more challenging and pushing toward the boundary of what physically possible. Huali Microeletronic Corporation™ is one of the leading semiconductor fabrication companies that has focused on the research and development of semiconductor devices and processes.

When fabricating transistors with typical gate dimensions below 50 nm, the so-called "high-k/metal gate" (HKMG) technology has become popular. According to the HKMG manufacturing process flow, an insulating layer included in the gate electrode is comprised of a high-k material. This is in contrast to the conventional oxide/polysilicon (poly/SiON) method, whereby the gate electrode insulating layer is typically comprised of an oxide, preferably silicon dioxide or silicon oxynitride in the case of silicon-based devices. Currently, two different approaches exist for implementing HKMG in the semiconductor fabrication process flow. In the first approach, called gate-first, the fabrication process flow is similar to that followed during the traditional poly/SiON method. Formation of the gate electrode, including the high-k dielectric film and the work function metal film, is initially performed, followed by the subsequent stages of transistor fabrication, e.g., definition of source and drain regions, silicidation of portions of the substrate surface, metallization, etc. On the other hand, according to the second scheme, also known as gate-last or replacement gate, fabrication stages such as dopant ion implantation, source and drain region formation and substrate silicidation are performed in the presence of a sacrificial dummy gate. The dummy gate is replaced by the real gate after the high-temperature source/drain formation and all silicide annealing cycles have been carried out.

Figure 1:
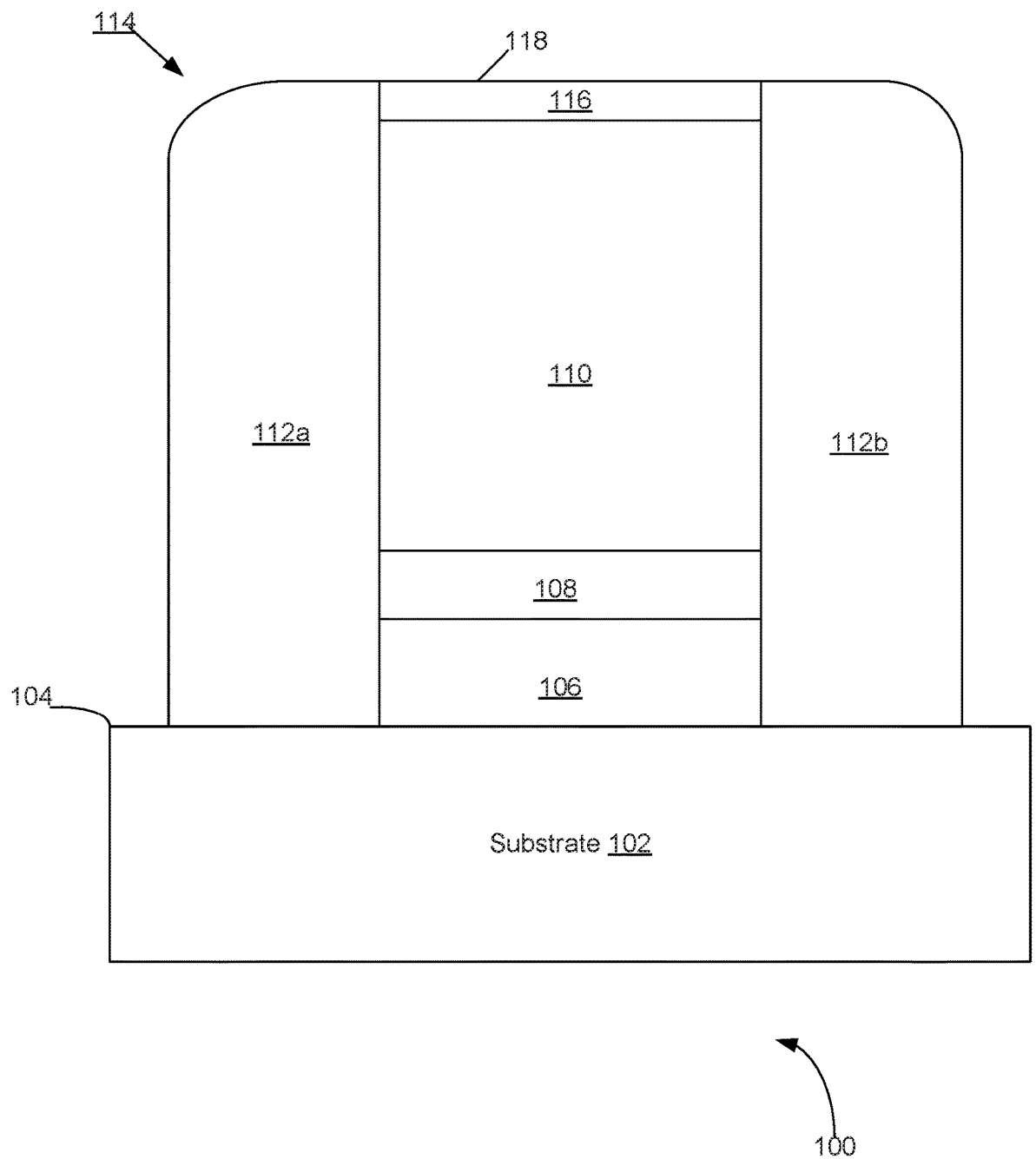
FIG. 1 schematically illustrates a cross-sectional view of a semiconductor structure in a gate-first HKMG manufacturing stage in an exemplary embodiment in accordance with the disclosure.

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The present disclosure relates to fabrication of high-k/metal gate (HKMG) stacks for semiconductors, in particular to reducing diffusion of O2 into the IL after the HKMG stack is formed.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification (including any accompanying claims, abstract, and drawings), may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. Section 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

A typical HKMG stack structure can contain a silicon oxide based interfacial layer (IL), a high-k (HK) dielectric, followed by a metal gate electrode. Hf-based dielectrics, HfO2 in particular, are the most widely used high-k dielectrics in current CMOS technology and are usually deposited on top of an IL, whose primary role is to provide good electrical quality of the interface with Si. A sub-nm chemical oxide (SiOx) or oxynitride (SiON) layer is typically employed as IL. Once initially deposited during the HKMG process, the SiO2 rich IL can grow thicker as a result of oxygen (O) is released and diffused to Si during HfO2 deposition. This O release forms thick bottom interface SiOx can cause increase of the thickness of IL and $T_{inv}$. This can severely limit scaling. In addition, the HK layer is also a poor barrier against oxygen in the air, and thus oxygen in the air can also be released to IL to cause the IL to grow thicker.

As an improvement, a decoupled plasma nitridation (DPN) process can be performed on top of the HK layer to form metal nitride that can prevent diffusion of oxygen from air. However, this process cannot remedy oxygen release from the HK layer mentioned above, and thus does not stop the afore-mentioned IL growth. As another improvement, Ti metal is grown on a cap of the HK layer to prevent diffusion of oxygen from air and as well as to shield ion and carrier on the surface of HK layer to prevent leakage currents. However, the Ti metal also does not remedy oxygen release from the inside of the HK layer.

The present disclosure addresses and solves the current problem of oxygen accumulation in IL after an HKMG stack is formed. One aspect of the present disclosure is a method of fabricating high-k/metal gate semiconductor device by forming at least one Titanium (Ti) layer between multiple HK layers. Another aspect of the present disclosure is a high-k/metal gate semiconductor device including at least one TiO2 layer between multiple HK layers.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method comprising: forming a high-k/metal gate stack by forming an insulation layer on a substrate. In one embodiment, the insulation layer can be formed by forming an interfacial layer (IL) on a surface of the substrate, a first HK layer on the IL layer, a Ti layer on the HK layer, a second HK layer on the Ti layer, and any other layers (if any).

FIGS. 1-5 illustrate some aspects of an integrated circuit having at least one Ti layer between at least two HK layers in accordance with the disclosure. The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Turning now to FIG. 1, which schematically illustrates a cross-sectional view of a semiconductor structure 100 in a gate-first HKMG manufacturing stage in an exemplary embodiment in accordance with the disclosure. As shown, the semiconductor structure 100 can have a semiconductor substrate 102. The substrate 102 can be, for example, a silicon material as typically used in the semiconductor industry, e.g., relatively pure silicon as well as silicon admixed with other elements such as germanium, carbon, and the like. Alternatively, the semiconductor material can be germanium, gallium arsenide, or the like. The semiconductor material may be provided as a bulk semiconductor substrate, or it could be provided on a silicon-on-insulator (SOI) substrate, which includes a support substrate, an insulator layer on the support substrate, and a layer of silicon material on the insulator layer. Further, the semiconductor substrate 102 may optionally include an epitaxial layer (epi layer). As shown, the semiconductor substrate 102 can have an upper surface 104.

As shown in this example, a gate structure 114 is formed on the upper surface 104 of substrate 102 during the gate-first HKMG manufacturing stage in accordance with the disclosure. The gate structure 114 can be formed by sequentially stacking layers of different materials, which can be subsequently patterned so as to obtain the desired gate structure size and dimensions. As shown, the stack making up the gate structure 114 can comprise: insulation layer 106 formed on the surface of the upper surface 104; gate metal layer 108; gate material 110; and a cap layer 116 formed adjacent to the gate material 110 and exposing an upper surface to the outside. As also shown, the gate structure 114 may be laterally delimited by spacers 112a-b.

In various embodiments, the insulation layer 106, formed on the upper surface 104, can comprise an IL layer, multiple HK layers comprising high-k material and at least one TiO2 layer between the HK layers. The IL may comprise materials such as silicon nitride or other suitable material, for example silicon oxynitride. High-k material in the HK layers may include a material with a dielectric constant "k" higher than 10. Examples of high-k materials used in the embodiments may include tantalum oxide (Ta2O5), strontium titanium oxide (SrTiO3), hafnium oxide (HfO2), hafnium silicon oxide (HfSiO), zirconium oxide (ZrO2) and the like.

The gate metal layer 108, formed on the insulation layer 106, may comprise a metal such as tantalum or tungsten. For example, the gate metal layer 108 may comprise a nitride such as titanium nitride or tantalum nitride. A certain percentage of a work function metal species, such as aluminum and the like, may be included in the gate metal layer 108, in combination with other materials. The gate material 110 can be formed on the gate metal layer 108. Typically, the gate material 110 comprises a semiconductor. In some embodiments, the gate material 110 comprises polysilicon. The cap layer 116 can be formed on top of the gate material 110. The cap layer 116 can comprises an upper surface 118 exposed towards the outside of the gate structure 114. The cap layer 116 typically comprises a tough insulator such as, for example, silicon nitride.

Figure 2A:
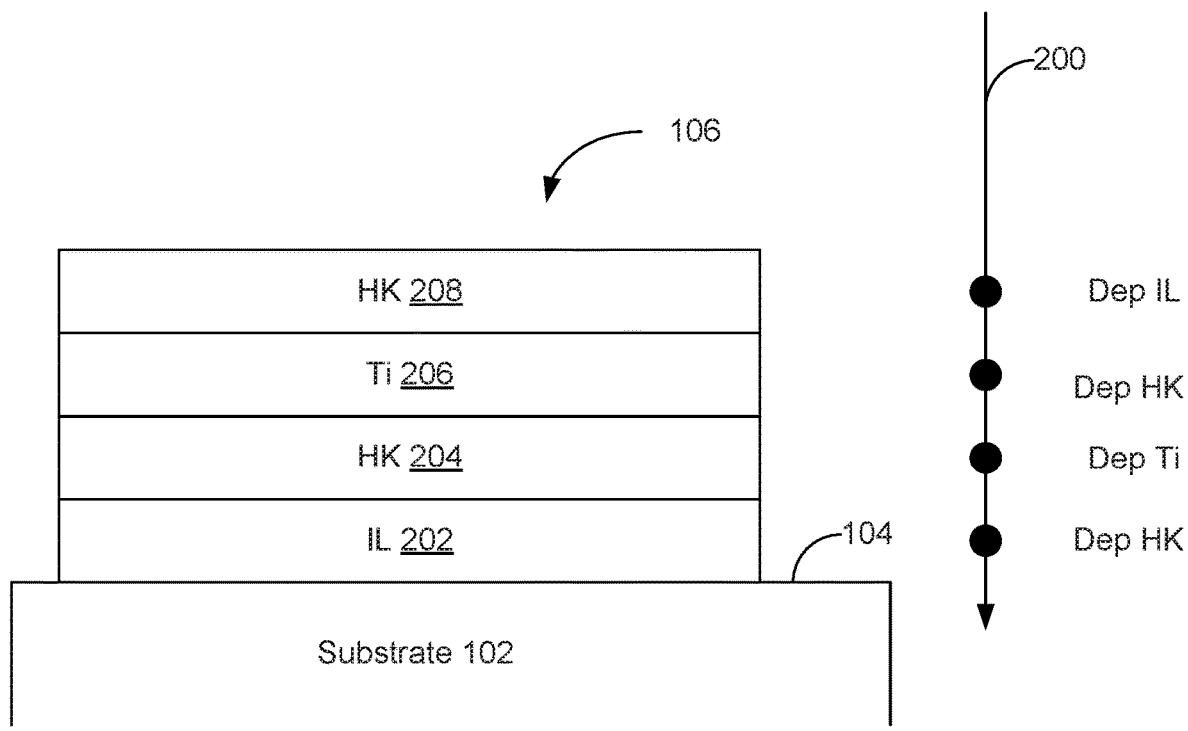
FIG. 2A illustrates an exemplary process flow for fabricating the HKMG device shown in FIG. 1.
Figure 2B:
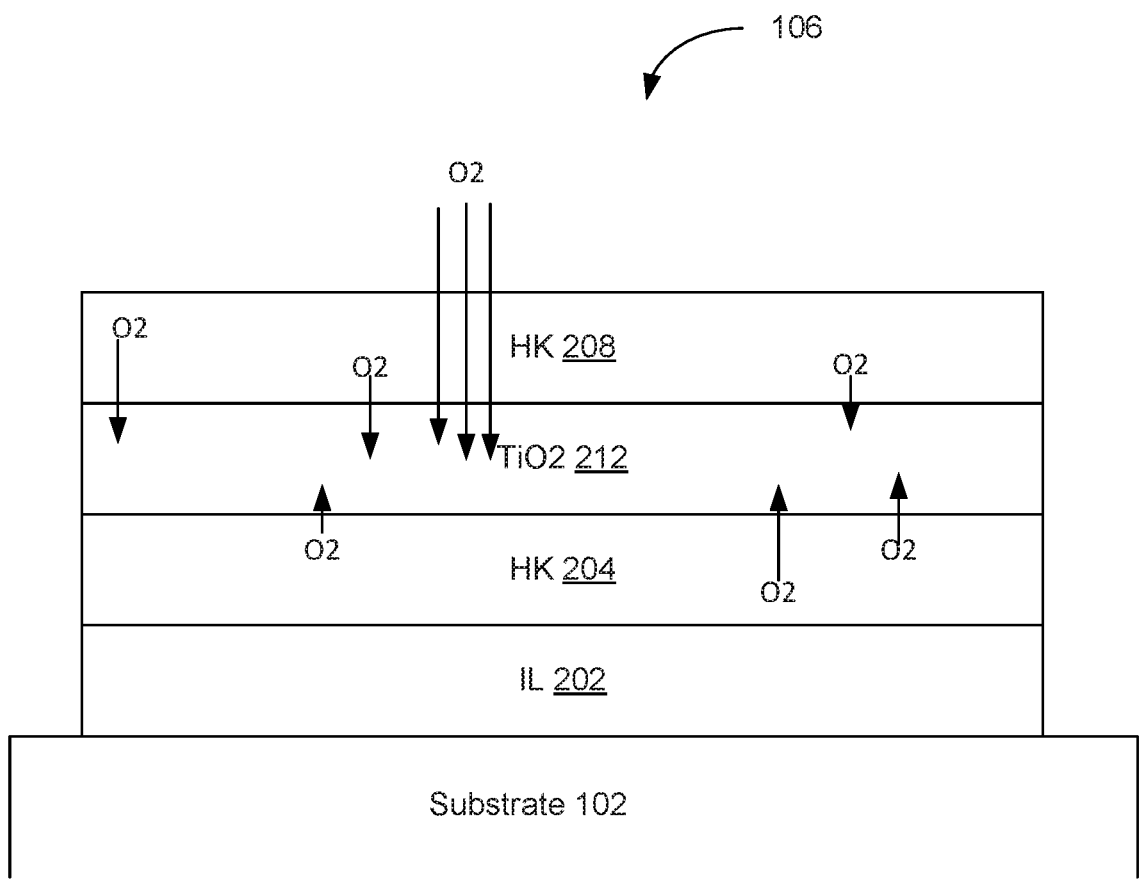
FIG. 2B shows that the Ti layer shown in FIG. 2A is oxidized after the gate structure shown in FIG. 2A is fabricated.

With a gate structure fabricated in a gate-first HKMG process having been generally described, attention is now directed to FIGS. 2A-B. FIG. 2A illustrates an exemplary process flow for fabricating the HKMG device shown in FIG. 1. As shown in this example, the fabrication process 200 can include: first depositing the IL 202 on top of the upper surface 104 of the substrate 102. In various embodiments, the IL 202 may be formed by any suitable process such as, chemical vapor deposition (CVD), atomic layer deposition (ALD), low-pressure CVD (PCVD), thermal oxidation, or any other suitable process for forming IL as known in the art. In one embodiment, the IL 202 is formed using thermal oxidation through a reactor tube.

As shown, after the IL 202 is formed, the fabrication process 200 can proceed to deposit a first HK layer 204 on top of the IL 202. In various embodiments, the first HK layer 204 may be formed by any suitable process such as physical vapor deposition (PVD), CVD or ALD. In some implementations, the thickness of the first HK layer is less than 1 nm. In one embodiment, the first HK layer 204 is formed using ALD.

As still shown, after the first HK layer 204 is deposited on top of the IL 202, the fabrication process 200 can proceed to deposit a Ti layer 206 on top of the first HK layer 204. The Ti layer 206 can include Titanium or Titanium alloy. The Ti layer 206 may be formed by using any suitable process such as PVD, CVD or ALD. In some implementations, the thickness of the first Ti layer is less than 0.5 nm. It should be noted the Ti layer 206 and the first HK layer 204 may be produced in a same chamber sequentially or different chambers sequentially. It should also be noted when HK layer 204 and Ti layer 206 are produced in the same chamber, it should be ensured that there is no air break between the two layers.

As also shown, after the first Ti layer 206 is deposited on top of the first HK layer 204, a second HK layer 208 can be deposited on top of the Ti layer 206. The process used to form the second HK layer 208 may be similar to the process used for forming the first HK layer 204. In some implementations, the thickness of the second HK layer 208 is less than 1 nm. In some implementation, the thickness of the second HK layer 208 is less than the thickness of the first HK layer 204. In one implementation, the total thickness of the first HK layer 204 and the second HK layer 206 is less than 2 nm.

FIG. 2B shows that the Ti layer 206 shown in FIG. 2A is oxidized after the gate structure 114 is fabricated. This is due to the Titanium in the Ti layer 206 has an affinity for oxygen. This property of the Ti layer 208 can thus result in the Ti layer 208 being sensitive to oxygen in the HK layers 204 and 208, and as well as the oxygen in the air. As shown in FIG. 2B, oxygen in the HK layers 204 and 208 that would have been released to the IL 202 in the conventional HKMG gate-first structure is absorbed by the Ti layer 206 formed in between the HK layers 204 and 208. As also shown, oxygen in the air can also be absorbed by the Ti layer 206 such that the Ti layer 206 becomes a barrier against oxygen diffusing into the IL 202 from the air. After the Ti layer 206 absorbs oxygen from HK layers 204 and 208, and/or from the air, the Ti layer 206 becomes oxidized to form a TiO2 layer 212 in between the HK layers 204 and 208 as shown.

Figure 3:
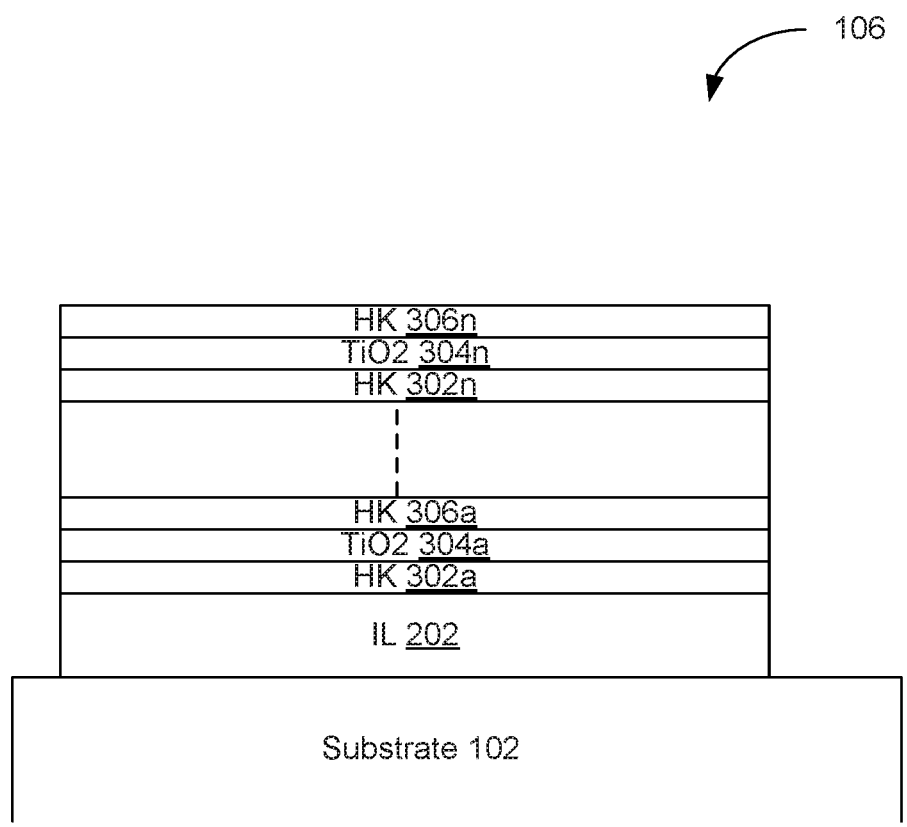
FIG. 3 shows more than one TiO2 layer can be formed within HK layers in the a high-k/metal gate structure in accordance with the disclosure.

It should be noted that although only one TiO2 layer 212 is shown in FIG. 2B, this should not be understood as limiting. More than one TiO2 layer 212 can be formed within HK layers in some other embodiments. For example, multiple TiO2 layers 212 can be formed between multiple HK layers in an interleaving fashion. This is shown in FIG. 3. In the example shown in FIG. 3, the total thickness of the HK layers, i.e., 302a-n and 306a-n, may be less than 2 nm, and the total TiO2 layers 304a-n may be less than 0.5 nm.

Figure 4:
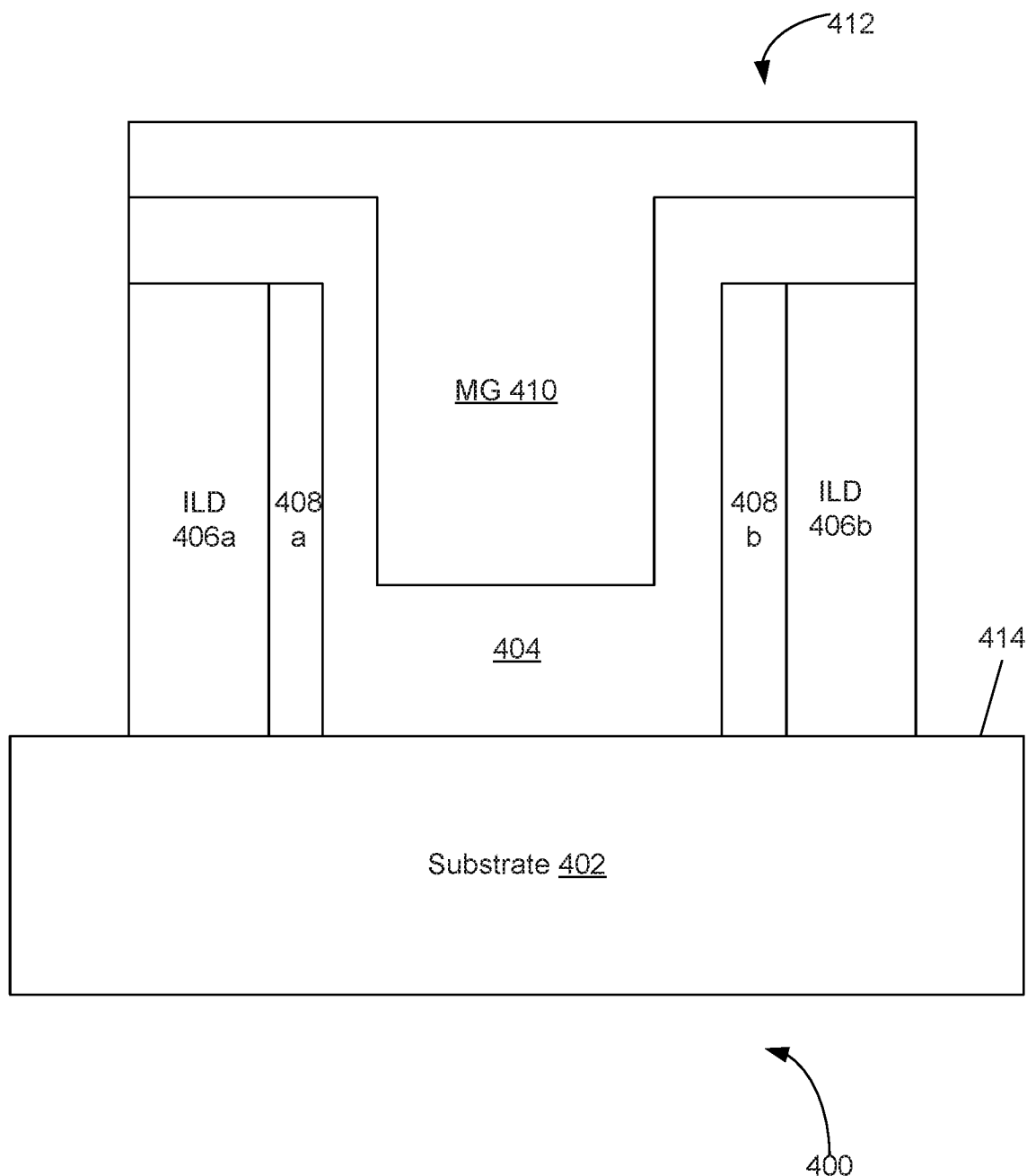
FIG. 4 schematically illustrates a cross-sectional view of a semiconductor structure in a gate-last HKMG manufacturing stage in an exemplary embodiment in accordance with the disclosure.

Turning now to FIG. 4, which schematically illustrates a cross-sectional view of a semiconductor structure 400 in a gate-last HKMG manufacturing stage in an exemplary embodiment in accordance with the disclosure. As shown, the semiconductor structure 400 can have a semiconductor substrate 402. The substrate 402 can be, for example, a silicon material as typically used in the semiconductor industry, e.g., relatively pure silicon as well as silicon admixed with other elements such as germanium, carbon, and the like. Alternatively, the semiconductor material can be germanium, gallium arsenide, or the like. The semiconductor material may be provided as a bulk semiconductor substrate, or it could be provided on a silicon-on-insulator (SOI) substrate, which includes a support substrate, an insulator layer on the support substrate, and a layer of silicon material on the insulator layer. Further, the semiconductor substrate 402 may optionally include an epitaxial layer (epi layer). As shown, the semiconductor substrate 402 can have an upper surface 404.

As shown in this example, a gate structure 412 is formed on the upper surface 414 of substrate 402. The gate structure 412 can be formed by first removing a polycrystalline silicon dummy gate and then filling in a metal gate electrode (MG) 410. As shown, the stack making up the gate structure 412 can comprise: insulation layer 404 formed on the upper surface 414; gate side walls 408a-b, interlayer dielectric layer (ILD) 406a-b, and MG 410. The polycrystalline silicon gate sidewalls 408a-b are spacers made of a material of silicon oxide or silicon nitride.

In various embodiments, the insulation layer 404, formed on the upper surface 414, can comprise an IL layer, multiple HK layers comprising high-k material and at least one TiO2 layer between the HK layers. The IL may comprise materials such as silicon nitride or other suitable material, for example silicon oxynitride. High-k material in the HK layers may include a material with a dielectric constant "k" higher than 10. Examples of high-k materials used in the embodiments may include tantalum oxide (Ta2O5), strontium titanium oxide (SrTiO3), hafnium oxide (HfO2), hafnium silicon oxide (HfSiO), zirconium oxide (ZrO2) and the like. The MG 410 can be filled in place of the removed polycrystalline silicon dummy gate through a filling process.

Figure 5A:
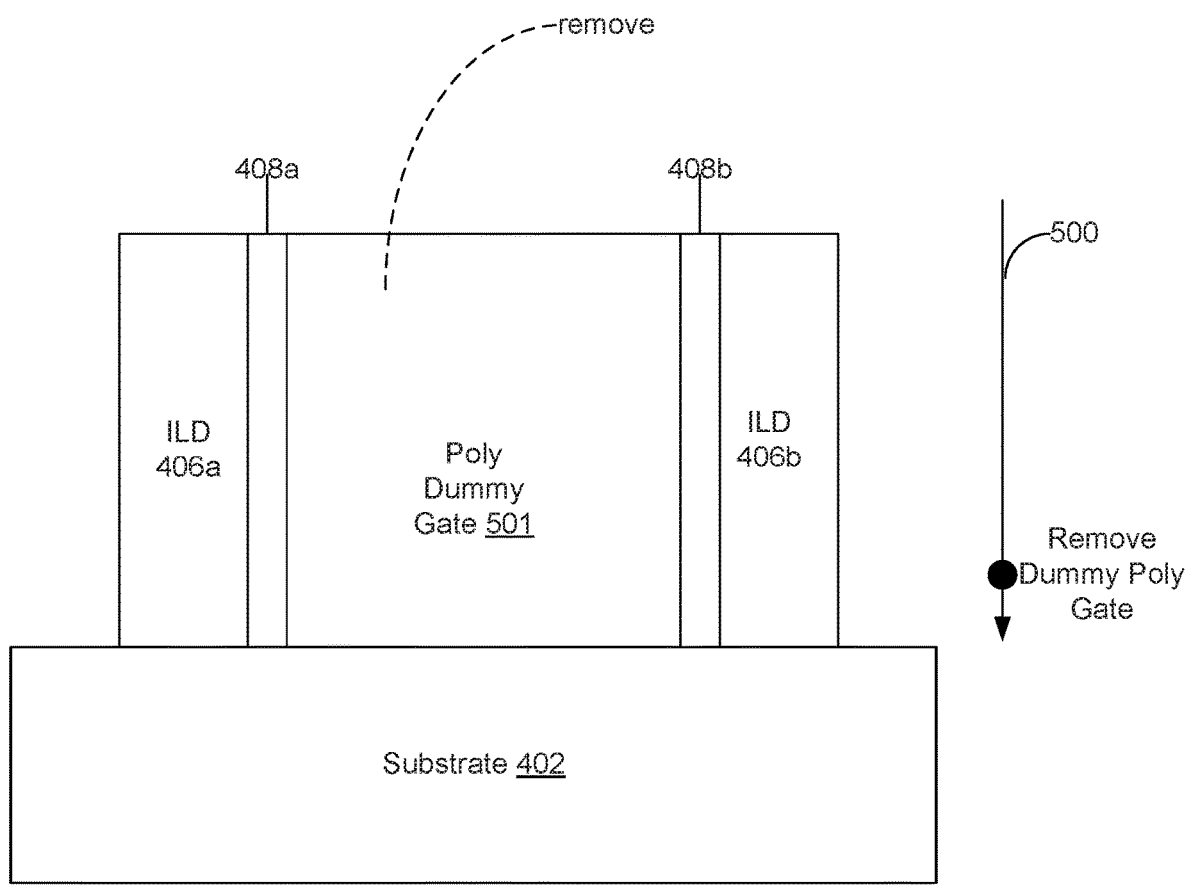
FIG. 5A illustrates a fabrication process for fabricating the gate structure shown in FIG. 4 can begin with removing a dummy poly gate.
Figure 5B:
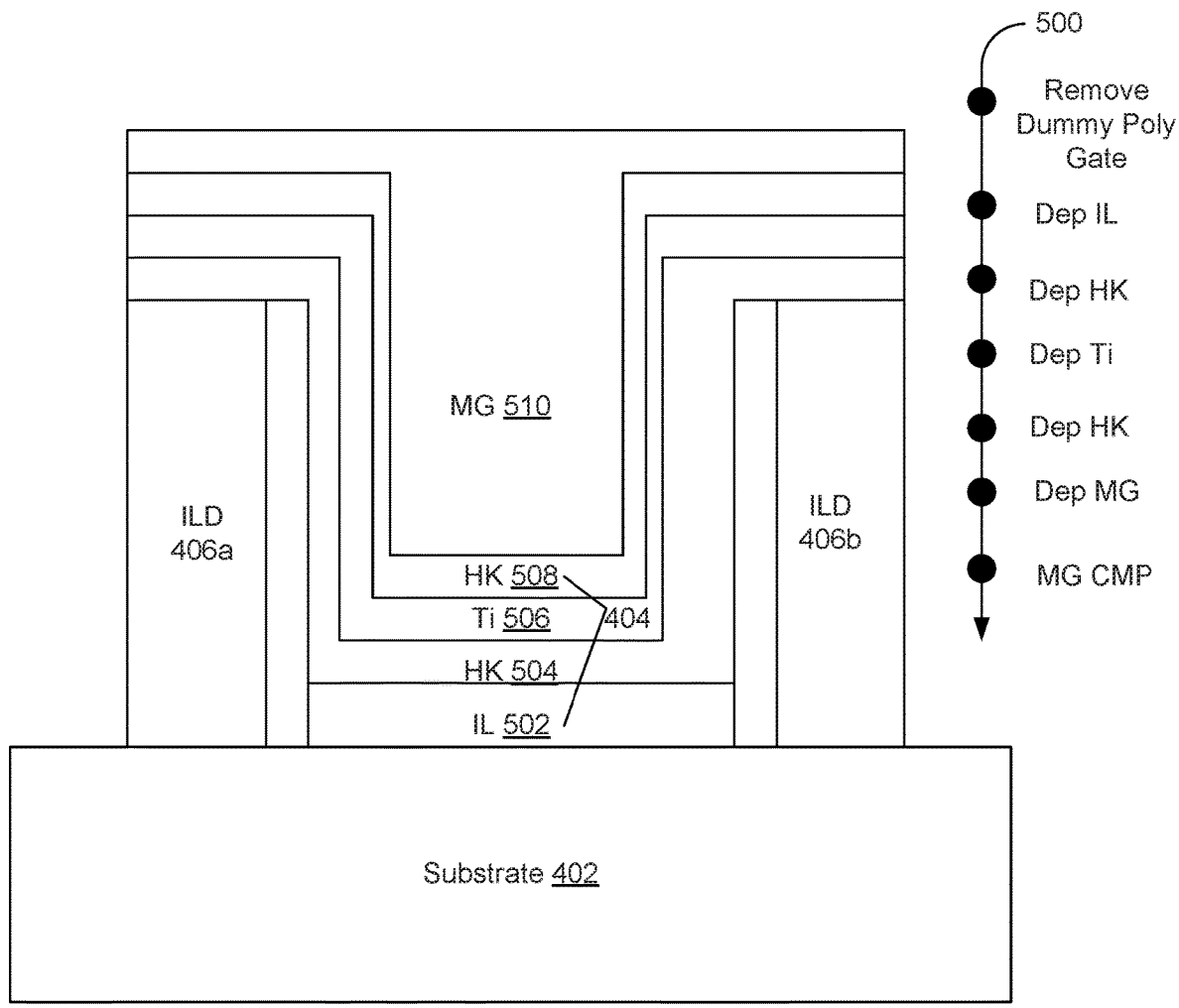
FIG. 5B shows after the dummy poly gate is removed, the fabrication process can proceed to deposit various materials to form the insulation layer shown in FIG. 4.
Figure 5C:
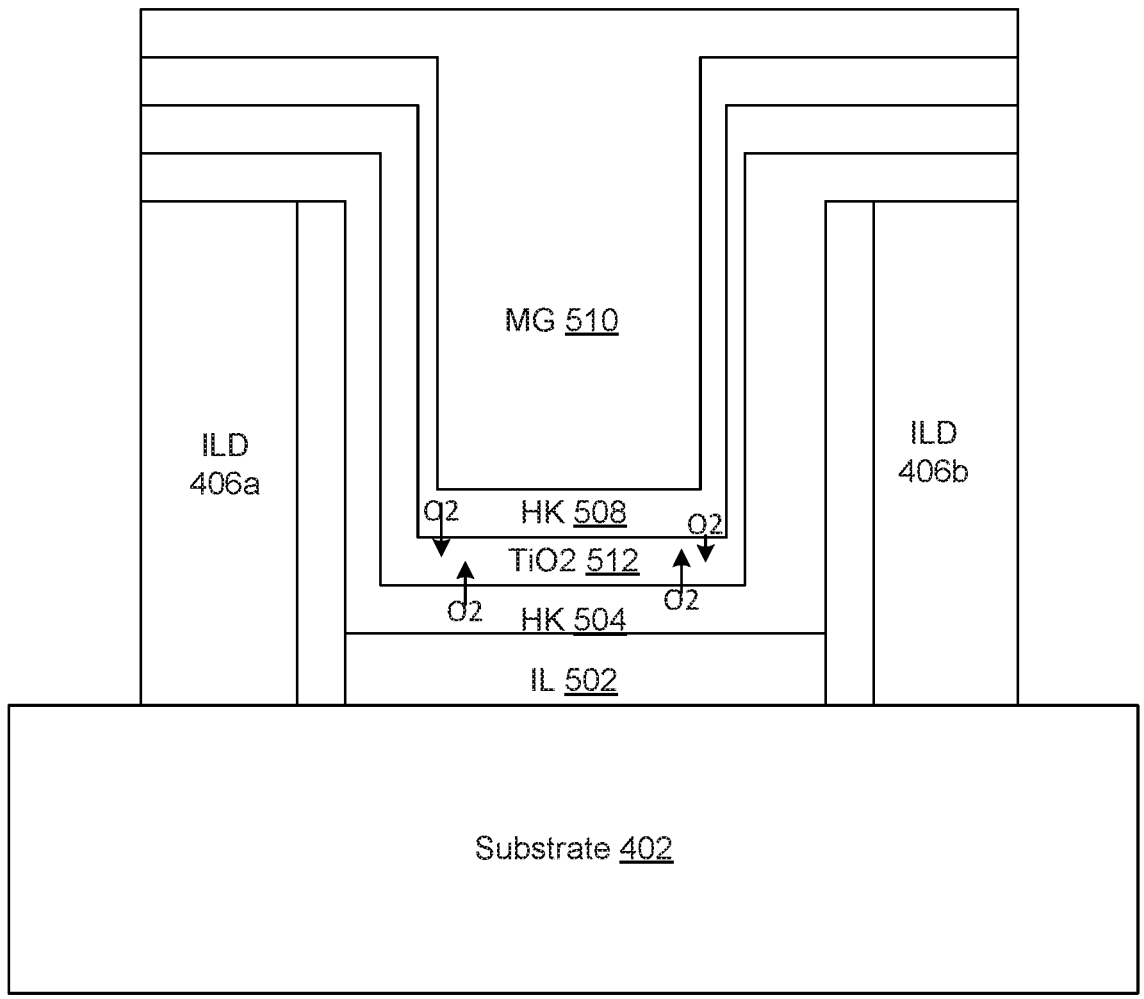
FIG. 5C shows that the Ti layer shown in FIG. 5B is oxidized to form a TiO2 layer similar to TiO2 layer shown in FIG. 2B.

With a gate structure fabricated through a in a gate-last HKMG process in accordance with the disclosure having been generally described, attention is now directed to FIGS. 5A-C for an exemplary fabrication process 500 for fabricating the gate structure 412 shown in FIG. 4. FIG. 5A illustrates the fabrication process 500 can begin with removing the dummy poly gate 501. The dummy poly gate 501 may be removed using any suitable removal process as known in the art. For example, the dummy poly gate 501 can be removed using a dry etching, wet chemical etching and/or dry-wet mixed etching process. After removing the poly dummy gate 501, an effective monitoring method may be performed to determine whether the polycrystalline silicon has been thoroughly removed from a trench in place of the dummy poly gate 501.

FIG. 5B shows after the dummy poly gate 501 is removed, the fabrication process 500 can proceed to deposit various materials to form the insulation layer 404 shown in FIG. 4. As shown for forming the insulation layer 404, the fabrication process 500 can include: first depositing the IL 502 on top of the upper surface 414 of the substrate 402. In various embodiments, the IL 502 may be formed by any suitable process such as, chemical vapor deposition (CVD), atomic layer deposition (ALD), low-pressure CVD (PCVD), thermal oxidation, or any other suitable process for forming IL as known in the art. In one embodiment, the IL layer is formed using thermal oxidation through a reactor tube.

As shown, after the IL 502 is formed, the fabrication process 500 can proceed to deposit a first HK layer 504 on top of the IL 502. In various embodiments, the first HK layer 504 may be formed by any suitable process such as physical vapor deposition (PVD), CVD or ALD. In some implementations, the thickness of the first HK layer 504 is less than 1 nm. In one embodiment, the first HK layer 504 is formed using ALD.

As still shown, after the first HK layer 504 is deposited on top of the IL 502, the fabrication process 500 can include depositing a Ti layer 506 on top of the first HK layer 504. The Ti layer 506 can include Titanium or Titanium alloy. The Ti layer 506 may be formed by using any suitable process such as PVD, CVD or ALD. In some implementations, the thickness of the first Ti layer is less than 0.5 nm. It should be noted the Ti layer 506 and the first HK layer 504 may be produced in a same chamber sequentially or different chambers sequentially. It should also be noted when HK 504 and Ti 506 are produced in the same chamber, it should be ensured that there is no air break between the two.

As also shown, after the first Ti layer 506 is deposited on top of the first HK layer 504, a second HK layer 508 can be deposited on top of the Ti layer 506. The process used to form the second HK layer 508 may be similar to the process used for forming the first HK layer 504. In some implementations, the thickness of the second HK layer 508 is less than 1 nm. In some implementation, the thickness of the second HK layer 508 is less than the thickness of the first HK layer 504. In one implementation, the total thickness of the first HK layer 504 and the second HK layer 506 is less than 5 nm.

After the second HK layer 508 is formed, MG 510 can be deposited on top of the second HK layer 508. After the MG 510 is formed, a chemical mechanical polish may be performed to remove excess portions of the metallic material.

FIG. 5C shows that the Ti layer 504 shown in FIG. 5B is oxidized to form a TiO2 layer 512 similar to TiO2 layer 312 shown in FIG. 2B. It should also be noted that although only one TiO2 layer 512 is shown in FIG. 5C, this should not be understood as limiting. More than one TiO2 layer can be formed within HK layers in some other embodiments. For example, multiple TiO2 layers 512 can be formed between multiple HK layers in an interleaving fashion. Please refer to FIG. 3 for such a structure that can be fabricated through a HKMG gate-last process in accordance with the disclosure.

Embodiments of the present invention provide many advantages over existing techniques and methods, as explained throughout the parts of the application. It is to be appreciated that embodiments of the present invention are compatible with existing systems and processes. For example, the shaped cavities described according to the embodiments of the present invention can be manufactured using existing equipment. The shaped cavities according to embodiments of the present invention can be easily used in manufacturing various types of devices, such as CMOS, PMOS, NMOS, etc.

While the above is a full description of the specific embodiments, various modifications, alternative constructions and equivalents may be used. In addition to what is described above, there are other embodiments as well. Therefore, the above description and illustrations should not be taken as limiting the scope of the present invention which is defined by the appended claims.

What is claimed is:

1. A semiconductor device comprising:
    a substrate comprising silicon material; and
    a gate electrode stack formed on the substrate, wherein the gate electrode stack comprising:
        an interfacial layer formed on an upper surface of the substrate;
        a first high-k dielectric layer formed on the interfacial layer;
        a first titanium (Ti) only layer formed on the first high-k dielectric layer;
        a second high-k dielectric layer formed on the first titanium only layer such that the first titanium only layer is not oxidized by a deposition process before the second high-k dielectric layer is formed on the first titanium only layer; and wherein the first titanium only layer is oxidized by oxygen from or through the first and the second high-k dielectric layer;
        a third high-k dielectric layer formed on the second high-k dielectric layer;
        a second titanium (Ti) only layer formed on the third high-k dielectric layer; and
        a fourth high-k dielectric layer formed on the second titanium only layer such that the second titanium only layer is not oxidized by a deposition process before the fourth high-k dielectric layer is formed on the second titanium only layer; and wherein the second titanium only layer is oxidized by oxygen from or through the third and the fourth high-k dielectric layers.

2. The semiconductor device of claim 1, wherein the gate electrode stack is formed using a high-k metal-gate gate-first process.

3. The semiconductor device of claim 1, wherein the gate electrode stack is formed using a high-k metal-gate gate-last process.

4. The semiconductor device of claim 1, wherein the first high-k dielectric layer is characterized by a thickness less than 1 nm.

5. The semiconductor device of claim 1, wherein the second high-k dielectric layer is characterized by a thickness less than 1 nm.

6. The semiconductor device of claim 1, wherein the second high-k dielectric layer is characterized by a thickness less than a thickness of the first high-k dielectric layer.

7. The semiconductor device of claim 1, wherein the first and second high-k dielectric layers are characterized by a combined thickness less than 2 nm.

8. The semiconductor device of claim 1, wherein the gate electrode stack further comprising at least one more composite structure, wherein the composite structure is formed by below method:
    forming a new first high-k dielectric layer on previous high-k dielectric layer;
    forming a new titanium (Ti) only layer on the new first high-k dielectric layer; and
    forming a new second high-k dielectric layer on the new titanium only layer such that the new titanium only layer is not oxidized by a deposition process before the new second high-k dielectric layer is formed on the new titanium only layer; and wherein the new titanium only layer is oxidized by oxygen from or through the new first and the new second high-k dielectric layers.

9. The semiconductor device of claim 8, wherein total thickness of all high-k dielectric layers is less than 2 nm.

10. The semiconductor device of claim 8, wherein total thickness of all oxidized titanium only layers is less than 0.5 nm.

11. A method for fabricating a high-k metal-gate, the method comprising:
 forming a substrate comprising silicon material; and
 forming a gate electrode stack on the substrate, wherein forming the gate electrode stack comprising:
  forming an interfacial layer on an upper surface of the substrate;
  forming a first high-k dielectric layer on the interfacial layer;
  forming a first titanium only layer on the first high-k dielectric layer without oxidizing the first titanium only layer;
  forming a second high dielectric layer on the first titanium only layer such that the first titanium only layer is not oxidized by a deposition process before the second high-k dielectric layer is formed on the first titanium only layer; and wherein the first titanium only layer is oxidized by oxygen from or through the first and the second high-k dielectric layers;
  forming a third high-k dielectric layer on the second high-k dielectric layer;
  forming a second titanium (Ti) only layer on the third high-k dielectric layer; and
  forming a fourth high-k dielectric layer on the second titanium only layer such that the second titanium only layer is not oxidized by a deposition process before the fourth high-k dielectric layer is formed on the second titanium only layer; and wherein the second titanium only layer is oxidized by oxygen from or through the third and the fourth high-k dielectric layers.

12. The method of claim 11, wherein the gate electrode stack is formed using a high-k metal-gate gate-first process.

13. The method of claim 11, wherein the gate electrode stack is formed using a high-k metal-gate gate-last process.

14. The method of claim 11, wherein the first high-k dielectric layer is characterized by a thickness less than 1 nm.

15. The method of claim 11 wherein the second high-k dielectric layer is characterized by a thickness less than 1 nm.

16. The method of claim 11, wherein the second high-k dielectric layer is characterized by a thickness less than a thickness of the first high-k dielectric layer.

17. The method of claim 11, wherein the first and second high-k dielectric layers are characterized by a combined thickness less than 2 nm.

18. The method of claim 11, wherein forming the gate electrode stack further comprising forming at least one more composite structure, wherein the composite structure is formed by below method:
 forming a new first high-k dielectric layer on previous high-k dielectric layer;
 forming a new titanium (Ti) only layer on the new first high-k dielectric layer; and
 forming a new second high-k dielectric layer on the new titanium only layer such that the new titanium only layer is not oxidized by a deposition process before the new second high-k dielectric layer is formed on the new titanium only layer; and wherein the new titanium only layer is oxidized by oxygen from or through the new first and the new second high-k dielectric layers.

19. The method of claim 18, wherein total thickness of all high-k dielectric layers is less than 2 nm.

20. The method of claim 18, wherein total thickness of all oxidized titanium only layers is less than 0.5 nm.

* * * * *